United States Patent
Furukawa et al.

(10) Patent No.: US 7,385,673 B2
(45) Date of Patent: Jun. 10, 2008

(54) IMMERSION LITHOGRAPHY WITH EQUALIZED PRESSURE ON AT LEAST PROJECTION OPTICS COMPONENT AND WAFER

(75) Inventors: Toshiharu Furukawa, Essex Junction, VT (US); Mark C. Hakey, Essex Junction, VT (US); Steven J. Holmes, Guilderland, NY (US); David V. Horak, Essex Junction, VT (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 11/160,156

(22) Filed: Jun. 10, 2005

(65) Prior Publication Data
US 2006/0289794 A1    Dec. 28, 2006

(51) Int. Cl.
*G03B 27/42* (2006.01)
(52) U.S. Cl. .......................................... 355/53; 355/30
(58) Field of Classification Search .............. 250/492.2, 250/492.21; 355/53, 30, 75
See application file for complete search history.

(56) References Cited

U.S. PATENT DOCUMENTS

| | | | |
|---|---|---|---|
| 3,610,757 A | 10/1971 | Van Valkenburg et al. | |
| 4,786,947 A | 11/1988 | Kosugi et al. | |
| 4,793,953 A | 12/1988 | Maus | |
| 5,900,354 A * | 5/1999 | Batchelder | 430/395 |
| 5,949,536 A | 9/1999 | Mark | |
| 6,212,989 B1 | 4/2001 | Beyer et al. | |
| 6,576,912 B2 | 6/2003 | Visser et al. | |
| 6,778,255 B2 | 8/2004 | Ogata | |
| 6,954,256 B2 * | 10/2005 | Flagello et al. | 355/53 |
| 2001/0035942 A1 | 11/2001 | Hara et al. | |
| 2001/0052967 A1 | 12/2001 | Ogura et al. | |
| 2002/0126269 A1 | 9/2002 | Sato | |
| 2002/0159042 A1 | 10/2002 | Poon | |
| 2003/0164929 A1 | 9/2003 | Tanimoto | |
| 2003/0174408 A1 | 9/2003 | Rostalski et al. | |
| 2004/0160583 A1 | 8/2004 | Hubertus et al. | |
| 2004/0180299 A1 | 9/2004 | Rolland et al. | |
| 2006/0114435 A1 * | 6/2006 | Hazelton et al. | 355/53 |

(Continued)

OTHER PUBLICATIONS

Switkes, M. et al., "Resolution Enhancement of 157 nm Lithography by Liquid Immersion," Optical Microlithography XV, Proceedings of SPIE, vol. 4691 (2002) pp. 459-465.

*Primary Examiner*—Robert Kim
*Assistant Examiner*—Johnnie L Smith, II
(74) *Attorney, Agent, or Firm*—Anthony J. Canale; Hoffman, Warnick & D'Alessandro LLC

(57) ABSTRACT

An immersion lithography apparatus and method, and a lithographic optical column structure are disclosed for conducting immersion lithography with at least the projection optics of the optical system and the wafer in different fluids at the same pressure. In particular, an immersion lithography apparatus is provided in which a supercritical fluid is introduced about the wafer, and another fluid, e.g., an inert gas, is introduced to at least the projection optics of the optical system at the same pressure to alleviate the need for a special lens. In addition, the invention includes an immersion lithography apparatus including a chamber filled with a supercritical immersion fluid and enclosing a wafer to be exposed and at least a projection optic component of the optical system.

6 Claims, 4 Drawing Sheets

U.S. PATENT DOCUMENTS

2006/0194449 A1* 8/2006 Takeishi et al. ............. 438/781
2006/0209281 A1* 9/2006 Hayashi ....................... 355/53
2006/0221315 A1* 10/2006 Beckers et al. ................ 355/30

* cited by examiner

IMMERSION LITHOGRAPHY WITH EQUALIZED PRESSURE ON AT LEAST PROJECTION OPTICS COMPONENT AND WAFER

BACKGROUND OF THE INVENTION

1. Technical Field

The present invention relates generally to semiconductor fabrication, and more particularly, to an immersion lithography apparatus and method, and a lithographic optical column structure for conducting immersion lithography with at least the projection optics of the optical system and the wafer under the same pressure.

2. Related Art

The ongoing pursuit of fabricating smaller semiconductor devices has currently caused the semiconductor fabrication industry to pursue advancements relative to immersion photolithography rather than dry photolithography. For example, the current focus in the industry has shifted from dry 157 nanometer (nm) wavelength lithography technology to immersion (wet) 193 nm wavelength lithography technology, with the objective to achieve immersion photolithography at 157 nm. Immersion photolithography approaches include filling a space between the last projection lens and the wafer in a lithography tool with a fluid having a higher refractive index (n) than the conventional fluid, i.e., air. As the refractive index increases, so does the numerical aperture (NA) of the optical lithography tool. The increased numerical aperture results in increased resolution of the pattern transfer process, and thus the potential for smaller devices.

In one approach, the fluid used is a liquid such as water, which provides a higher refractive index than air (e.g., air n=1, water n=1.44). Unfortunately, the extension of immersion lithography to 157 nm wavelengths is complicated by the lack of transparent liquid media that can be used as a liquid immersion material, e.g., water absorbs 157 nm light. Other challenges to this approach include prevention of bubbles in the liquid during exposure, inadequate wetting, wafer contamination and complexity. Another approach that addresses, inter alia, the transparency issue is use of a supercritical fluid, such as disclosed in U.S. Pat. No. 5,900,354 to Batchelder. One fluid disclosed in that reference is xenon (Xe), which is transparent at 157 nm and has a refractive index of 1.38, which is suitable for the immersion application and forms a supercritical state at room temperature. This approach is promising because it provides adequate optical transparency at 157 nm, and also eliminates the bubble formation problem with liquid immersion systems. A challenge facing widespread implementation of supercritical fluid immersion systems, however, is that they require high pressure (e.g., >60 atmospheres) to obtain the supercritical state, which distorts lithographic optical elements. For example, the above-described device requires an optical element 26 (FIG. 2 thereof) for transitioning between the high pressure supercritical fluid and ambient air.

In view of the foregoing, there is a need in the art for an immersion lithography apparatus and method that avoid the problems of the related art.

SUMMARY OF THE INVENTION

The invention solves the above-described problems, inter alia, by providing an immersion lithography apparatus and method, and a lithographic optical column structure are disclosed for conducting immersion lithography with at least the projection optics of the optical system and the wafer in different fluids at the same pressure. In particular, an immersion lithography apparatus is provided in which a supercritical fluid is introduced about the wafer, and another fluid, e.g., an inert gas, is introduced to at least the projection optics of the optical system at the same pressure so it is able to withstand high pressure differentials and to alleviate the need for a special lens. In addition, the invention includes an immersion lithography apparatus including a chamber filled with a supercritical immersion fluid and enclosing a wafer to be exposed and at least a projection optic component of the optical system.

A first aspect of the invention is directed to an immersion lithography apparatus, the apparatus comprising: a first chamber adapted for holding a wafer, the first chamber filled with a first fluid at a pressure; and a second chamber positioned over the first chamber and including at least a projection optic component of an optical system for projecting radiation onto the wafer, the second chamber filled with a second fluid that is different than the first fluid and is at substantially the pressure.

A second aspect of the invention includes a method of conducting immersion lithography on a wafer using an immersion lithography tool including an optical system, the method comprising the steps of: placing the wafer in a first chamber filled with a first supercritical fluid at a first pressure; placing at least a projection optic component of the optical system in a second chamber filled with a second fluid that is different than the first fluid and is at a second pressure substantially equal to the first pressure; and projecting radiation to expose a pattern on the wafer using the optical system.

A third aspect of the invention related to an immersion lithography apparatus, the apparatus comprising: a chamber adapted for enclosing a wafer to be exposed and at least a projection optic component of an optical system for projecting radiation onto the wafer, wherein the chamber is filled with a supercritical immersion fluid such that the at least the projection optic component of the optical system is immersed in the supercritical immersion fluid.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
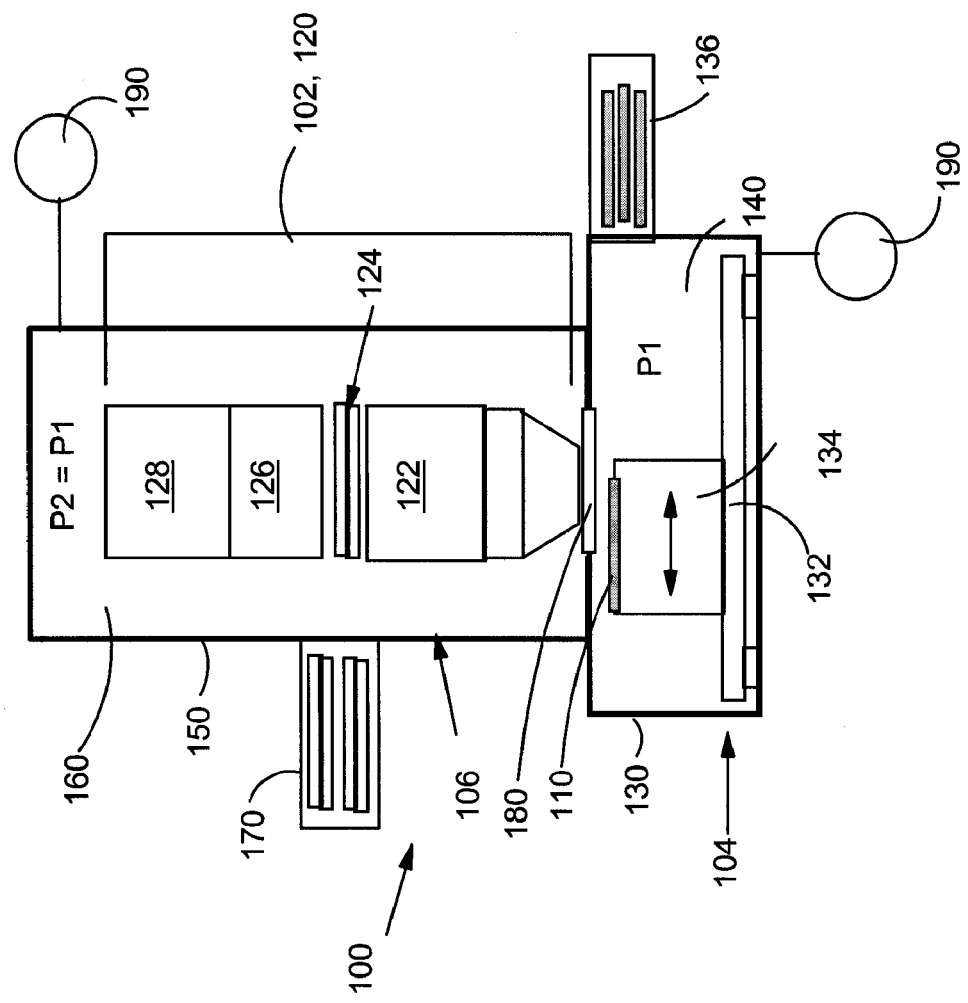
FIG. 1 shows a first embodiment of an immersion lithography apparatus according to the invention.

With reference to the accompanying drawings, FIG. 1 illustrates a first embodiment of an immersion lithography apparatus 100 according to the invention. Apparatus 100 includes a lithographic optical column structure 102, which will be described along with apparatus 100. As shown in FIG. 1, apparatus 100 includes a first chamber 104 and a second chamber 106. First chamber 104 is adapted for holding a wafer 110 to be irradiated with any now known or later developed optical system 120 for projecting radiation onto wafer 110. An illustrative optical system 120 may include, inter alia, projection optic component 122, a mask 124, condenser 126 and illuminator 128. First chamber 104 also includes conventional automated wafer support structure such as an enclosure 130, a wafer table 132, a wafer stage 134, and a load lock 136. Load lock 136 may include conventional structure such as gate valves, support table, transfer robot, etc., for allowing ingress/egress of wafer(s) 110.

First chamber 104 is filled with a first fluid 140 at a pressure P1. In one embodiment, first fluid 140 includes xenon (Xe) in a supercritical state, e.g., at a pressure of approximately 63 atmospheres and a temperature of greater than 23° C. However, first fluid 140 may include any now known or later developed supercritical material for use with immersion lithography. Supercritical fluid 140 allows immersion lithography as described in U.S. Pat. No. 5,900,354.

Second chamber 106 includes an enclosure 150 for enclosing at least projection optic component 122 of optical system 120. While second chamber 106 is illustrated as positioned over first chamber 104, this is not necessary. Second chamber 106 is filled with a second fluid 160 that is different than first fluid 140. In one embodiment, second fluid 160 includes an inert gas such as helium (He) and/or nitrogen ($N_2$). Second fluid 160 is at a second pressure P2 that substantially equal to first pressure P1, i.e., P2=P1. In this fashion, a special lens is not required between first chamber 104 and optical system 120. At least one pressure regulator 190 may be provided to regulate the pressure of each chamber 104, 106.

In the embodiment shown in FIG. 1, all of optical system 120 is provided in second chamber 106. This structure requires another load lock 170, i.e., including conventional structure such as gate valves, support table, transfer robot, etc., for allowing ingress/egress of mask(s) 124. A window 180 is placed to allow passage of radiation between chambers 104, 106. Since the pressures P1 and P2 are substantially equal, however, a special lens is not required between first chamber 104 and optical system 120. In another preferred embodiment, shown in FIG. 2, an immersion lithography apparatus 101 including only projection optic component 122 in second chamber 206 is provided. Here, again, a window 180 is placed to allow passage of radiation between chambers 104, 206, but since the pressures P1 and P2 are substantially equal, a special lens is not required between first chamber 104 and projection optic component 122. This embodiment eliminates the need for a second load lock 170 (FIG. 1), since mask 124 is provided at atmospheric pressure. However, in this embodiment, a pressure-resistant window 182, which must be able to withstand the pressure difference, must be provided between atmospheric pressure and second chamber 106.

In some high numerical aperture (NA) optical systems, catadioptric lenses may be used with mirrors used to bend the light rays to form the aerial image of the chip pattern. When mirrors are used to bend the light, the refractive index of the fluid between the lenses may not be an important factor in the formation of the aerial image. On the other hand, for refractive optics, the bending of the light rays as they pass from the lens to the transmission medium may play a critical role in the formation of the aerial image. Balancing of the pressure, as provided by the above-described embodiment, in column 102 would avoid pressure-induced distortions to the column that could degrade the aerial image, but still allow the immersion lens to be formed with supercritical fluid 140 in the wafer exposure region, i.e., first chamber 104. In some cases, the refractive index of the supercritical fluid might not be readily altered to match the needs of the refractive optics system. In this case, another gas/fluid may be used in the optical column, such as nitrogen or helium, which might have a better refractive index to match the needs of the optics. The supercritical xenon fluid would still be present in the wafer chamber to provide less refraction of the exposure light as it exits the optical column.)

The invention also includes a method of conducting immersion lithography on a wafer 110 using an immersion lithography apparatus 100 including optical system 120. The method includes: placing wafer 110 in first chamber 104 filled with first supercritical fluid 140 (e.g., supercritical xenon (Xe) at greater than 23° C.) at first pressure P1 (e.g., approximately 63 atmospheres), and placing at least projection optic component 122 of optical system 120 in second chamber 106 filled with second fluid 160 (e.g., inert gas such as He and/or $N_2$) that is different than first fluid 140 and is at a second pressure P2 substantially equal to first pressure P1. Radiation, e.g., light, can then be projected to expose a pattern (from mask 124) on wafer 110 using optical system 120. Window 180 may be provided between first chamber 104 and second chamber 106, allowing passage of radiation.

The invention also includes lithographic optical column structure 102 for immersion lithography apparatus 100 including a process chamber 104 adapted for holding wafer 110 surrounded by supercritical fluid 140 (e.g., xenon (Xe) in a supercritical state). Structure 102 includes optical system 120 for projecting radiation onto wafer 110 and including, inter alia, illuminator component 128, a mask 124 and a projection optic component 122, an optical system chamber 106 for enclosing at least the projection optic component 122 in an optics fluid 160 (e.g., including a gas such as an inert gas such as nitrogen and/or helium) that is different than supercritical fluid 140; and a pressure regulator 190 for maintaining at least the projection optic component at a pressure P2 substantially equal to a pressure P1 of process chamber 104.

Figure 2:
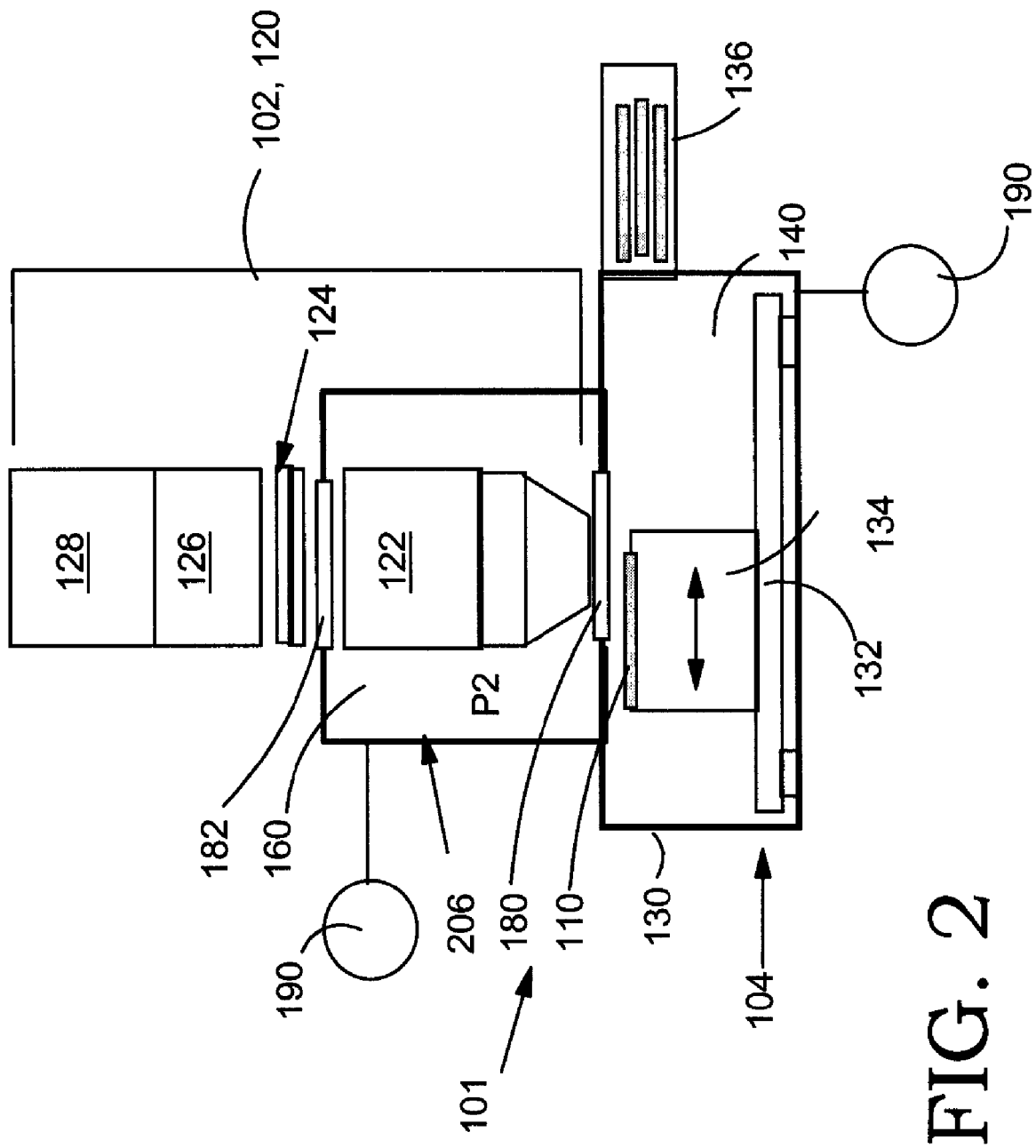
FIG. 2 shows a second embodiment of an immersion lithography apparatus according to the invention.
Figure 3:
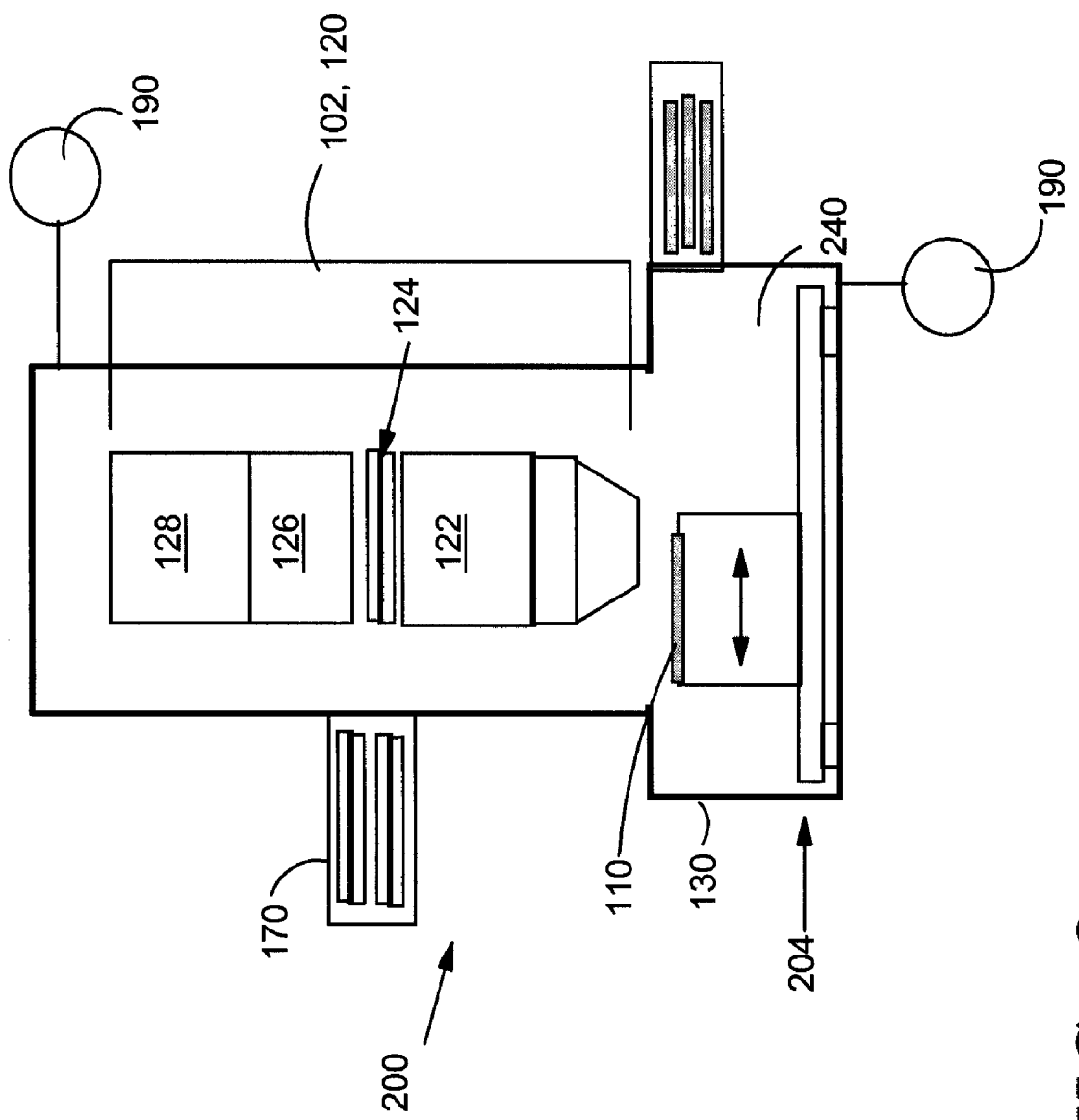
FIG. 3 shows a third embodiment of an immersion lithography apparatus according to the invention.
Figure 4:
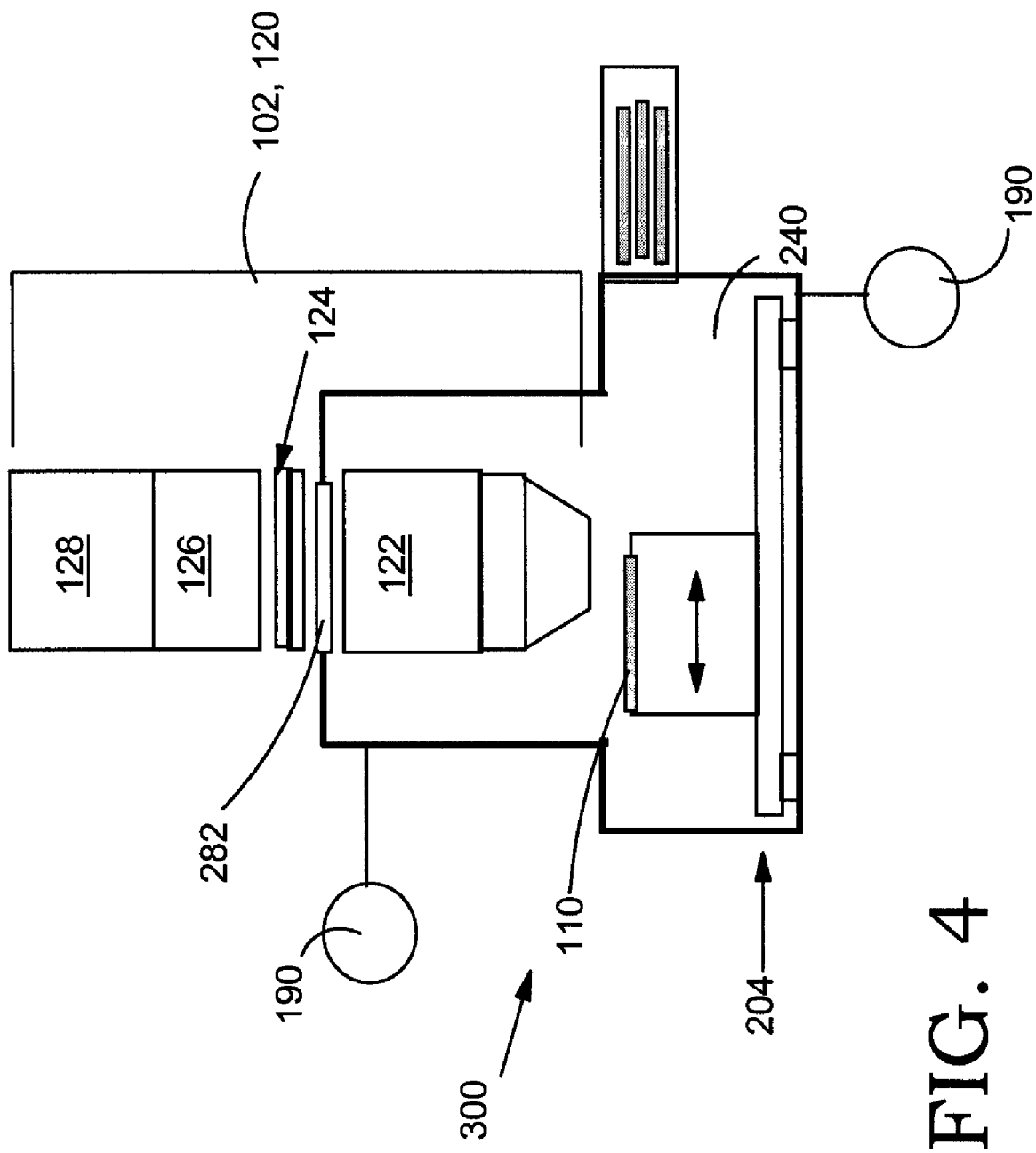
FIG. 4 shows a fourth embodiment of an immersion lithography apparatus according to the invention.

Referring to FIGS. 3-4, alternative third and fourth embodiments of the invention will now be described. As shown in FIGS. 3-4, a third and fourth embodiment includes an immersion lithography apparatus 200, 300, respectively, including all of the structure of apparatus 100 (FIG. 1), except that only one chamber 204 is provided to enclose wafer 110, i.e., no window 180 (FIGS. 1-2). In FIGS. 3-4, at least projection optic component 122 of optical system 120 is enclosed in chamber 204 for projecting radiation onto wafer 110. FIG. 3 illustrates an embodiment in which all of optical system 120 is enclosed in chamber 204. In this case, a load lock 270, as described above, for chamber 204 to allow ingress/egress of a mask 124 of optical system 120 is provided. FIG. 4 illustrates an embodiment in which only projection optic component 122 of optical system 120 is enclosed in chamber 204. In this case, load lock 270 (FIG. 3) is not necessary, but a pressure-resistant window 282 to allow light to pass from the rest of the optical system to projection optic component 122 is provided.

In contrast to FIGS. 1-2, the FIGS. 3-4 embodiments include filling chamber 204 with a supercritical immersion fluid 240 such that the at least the projection optic component 122 of optical system 120 is immersed in the supercritical immersion fluid, along with wafer 110. Supercritical immersion fluid 240 may include supercritical xenon (Xe) at a pressure of approximately 63 atmospheres and a temperature greater than 23° C., as described above, or any later developed supercritical immersion fluid. Since the pressure on at least projection optic component 122 is substantially equal to that on wafer 110, a special lens is not required between projection optic component 122 and wafer 110. As described above, at least one pressure regulator 190 may be used to control the pressure in chamber 204.

It should be understood by those skilled in that art that other structure related to immersion lithography apparatus 100, 101, 200 or 300 (e.g., controllers, valves, vibration controls, etc.) have been omitted for clarity sake, but are considered part of the invention.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of conducting immersion lithography on a wafer using an immersion lithography tool including an optical system, the method comprising the steps of:

placing the wafer in a first chamber filled with a first supercritical fluid at a first pressure;

placing at least a projection optic component of the optical system in a second chamber filled with a second fluid that is different than the first fluid and is at a second pressure substantially equal to the first pressure; and projecting radiation to expose a pattern on the wafer using the optical system.

2. The method of claim 1, further comprising the step of providing a window between the first chamber and the second chamber allowing passage of radiation.

3. The method of claim 1, wherein the first fluid includes supercritical xenon (Xe), and the first pressure approximately 63 atmospheres, and a temperature of the first chamber is greater than 23° C.

4. The method of claim 1, wherein the second fluid includes a gas including at least one of the following: helium (He) and nitrogen ($N_2$).

5. The method of claim 1, further comprising the step of providing at least one pressure regulator adapted to regulate the pressure of each chamber.

6. The method of claim 1, wherein the second chamber includes only the projection optic component of the optical system, and farther comprising the step of providing a pressure-resistant window to allow light to pass from the rest of the optical system to the projection optic component.

* * * * *